United States Patent [19]
Ginn et al.

[11] Patent Number: 5,827,771
[45] Date of Patent: Oct. 27, 1998

[54] READOUT BACKSIDE PROCESSING FOR HYBRIDIZATION

[75] Inventors: Robert P. Ginn, Ventura; Joan K. Chia, Santa Barbara; Stephen H. Propst, Santa Ynez, all of Calif.

[73] Assignee: Raytheon Company, Lexington, Mass.

[21] Appl. No.: 618,135

[22] Filed: Mar. 19, 1996

[51] Int. Cl.$^6$ .......................... H01L 21/30; H01L 21/46; H01L 21/66; G01R 31/26

[52] U.S. Cl. ............................................... 438/457; 438/15

[58] Field of Search .................. 437/8, 183; 228/180.22; 250/322; 438/15, 18, 457

[56] References Cited

U.S. PATENT DOCUMENTS

| | | | |
|---|---|---|---|
| 4,865,245 | 9/1989 | Schulte et al. | 228/116 |
| 5,308,980 | 5/1994 | Barton | 437/3 |
| 5,585,624 | 12/1996 | Anatourian et al. | 250/216 |

*Primary Examiner*—Brian Dutton
*Attorney, Agent, or Firm*—W. C. Schubert; G. H. Lenzen, Jr.

[57] ABSTRACT

This invention pertains to a method for processing readout integrated circuits, and to a readout integrated circuit (10) that is processed in accordance with the method. The method includes a first step of providing a plurality of individual readout circuits each having a substrate (12) and at least one layer (14) constructed to have active circuitry that overlies a first surface (12a) of the substrate. Each of the readout integrated circuits has an associated amount of non-flatness or bowing due at least in part to a first force exerted on the substrate by the at least one layer of circuitry. A next step sorts the plurality of readout integrated circuits into a plurality of groups (A, B, C), wherein members of a group have a similar amount of non-flatness. A next step of the method determines, for each group, a thickness of compensating layer (18) and then applies the compensating layer on a second surface (12b) of the substrate so as to exert a second force on the substrate to counteract the first force and to reduce the amount of non-flatness. In a presently preferred embodiment of the invention the step of applying includes a step of sputtering a layer comprised of $Si_3N_4$ upon the second surface. The step of sorting includes the steps of operating an interferometer to generate a pattern of fringes for indicating a degree of non-flatness of each of the readout integrated circuits; and counting the fringes and sorting the readout integrated circuits as a function of the number of fringes.

10 Claims, 2 Drawing Sheets

READOUT BACKSIDE PROCESSING FOR HYBRIDIZATION

FIELD OF THE INVENTION

This invention relates generally to integrated circuit fabrication techniques and, in particular, to readout integrated circuits that are fabricated to be hybridized with an array of radiation detectors.

BACKGROUND OF THE INVENTION

Silicon wafers used to fabricate readout integrated circuits (ROICS), such as transimpedance amplifiers and the like, can be purchased "flat" to within 8 $\mu$m of bowing across a 4–6 inch wafer. However, it has been found that after die processing is completed, and individual ROIC die are diced out of the wafer, the bowing across one ROIC die or chip can be greater than 3 $\mu$m. The primary cause of this additional bowing is the stress resulting from the deposition of numerous layers of metals, oxides, and polysilicon layers that are used to define the electrical circuitry over one surface of the silicon wafer or substrate.

A problem is created in that this degree of non-flatness of the ROIC chip is unsuitable for hybridization of the ROIC chip with a radiation detector array chip, which typically requires that the two chips be mated to within 5–10 $\mu$m. Conventional techniques for hybridizing the two chips include the use of an optical interferometer for alignment purposes, and the cold welding of opposing pairs of metallic bumps. By example, one suitable technique for processing indium bump interconnects is disclosed in commonly assigned U.S. Pat. No. 4,865,245, "Oxide Removal from Metallic Contact Bumps Formed on Semiconductor Devices to Improve Hybridization Cold-Welds", by E. F. Schulte et al.

As may be appreciated, and as is evident in FIG. 1, an excessive amount of bowing (e.g., 3 $\mu$m) of the ROIC chip 1 including a layer 1a of circuitry can cause the indium bumps 2 in the corners of the chip to be at a different distance, relative to centrally disposed indium bumps, from the corresponding indium bumps 3 on a radiation detector array 4 to which the ROIC is to hybridized. The result can be a non-uniform cold-weld strength across the hybrid assembly, and a potential for interconnect failure.

Furthermore, the bowing or degree of non-flatness of the ROIC chips from a given wafer is not uniform, but typically varies between ROIC chips as a function of the position of the ROIC chip before it was diced from the wafer.

OBJECTS OF THE INVENTION

It is a first object of this invention to provide a method for fabricating an integrated circuit chip that overcomes the foregoing and other problems.

It is second object of this invention to provide a method for fabricating a readout integrated circuit chip having a reduced bowing, and that has a flatness compatible with hybridization requirements.

It is a further object of this invention to provide a readout integrated circuit chip that includes a layer of dielectric or other suitable material applied to a surface opposite a surface having circuit patterns, the layer having a thickness suitable for reducing a bowing and thus increasing a flatness of the readout integrated circuit chip.

SUMMARY OF THE INVENTION

The foregoing and other problems are overcome and the objects of the invention are realized by the deposition of a film or layer on the backside (unprocessed side) of a readout integrated circuit (ROIC) to counteract the stress and resultant bowing produced by the circuitry and films on the opposite (frontside) face. The "flattened ROIC" that is fabricated in accordance with this invention may then be hybridized with an array of radiation detectors to form a focal plane array (FPA) hybrid assembly.

In accordance with this invention the deposition of a thin film (such as a film comprised of $Si_3N_4$) on the backside surface of the ROIC acts to balance and counteract the deforming stress generated by the circuit layer(s) on the frontside surface. Certain film characteristics (e.g., thickness and stress) can be varied to account for different amounts of bowing observed between uncoated ROICs, thus allowing flattening of any ROIC chip from a given wafer to, by example, less than 1 $\mu$m.

Improvements in hybridization are observed in the areas of increased visibility of alignment marks due to decreased reflectance from the ROIC backside surface, reduced slippage (i.e., movement of the arrays in x or y relative to each other), and improved corner cold-welding.

In accordance with an aspect of this invention there is taught a method for processing readout integrated circuits, and a readout integrated circuit that is processed in accordance with the method. The method includes a first step of providing a plurality of individual readout circuits each having a substrate and at least one layer comprised of active circuitry overlying a first surface of the substrate. Each of the readout integrated circuits has an associated amount of non-flatness or bowing due at least in part to a first force exerted on the substrate by the at least one layer of circuitry. A next step sorts the plurality of readout integrated circuits into a plurality of groups, wherein members of a group have a similar amount of non-flatness. A next step of the method determines, for each group, a thickness of at least one compensating layer and then applies the compensating layer on a second surface of the substrate so as to exert a second force on the substrate to counteract the first force and to reduce the amount of non-flatness. In a presently preferred embodiment of the invention the step of applying includes a step of sputtering a layer comprised of $Si_3N_4$ upon the second surface.

The step of sorting includes the steps of operating an interferometer to generate a pattern of fringes for indicating a degree of non-flatness of each of the readout integrated circuits; and counting the fringes and sorting the readout integrated circuits as a function of the number of fringes.

BRIEF DESCRIPTION OF THE DRAWINGS

The above set forth and other features of the invention are made more apparent in the ensuing Detailed Description of the Invention when read in conjunction with the attached Drawings, wherein.

DETAILED DESCRIPTION OF THE INVENTION

Figure 2:
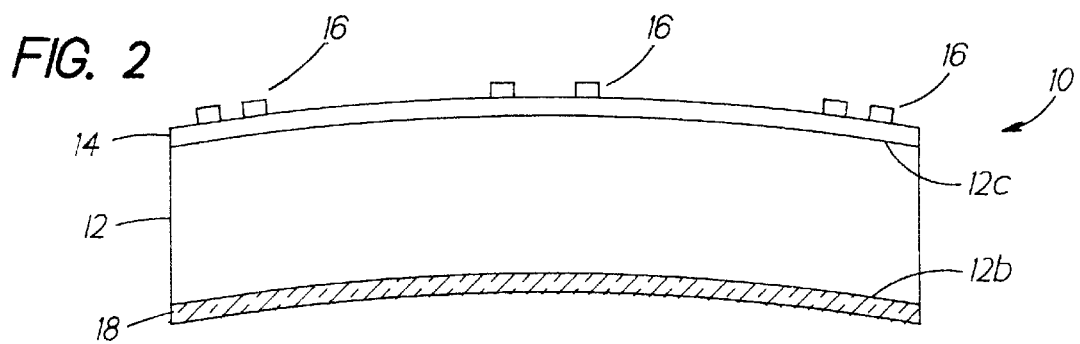
FIG. 2 is an enlarged side view, not to scale, of a ROIC that has been processed to reduce an amount of bowing, and hence increase the flatness, in accordance with this invention.

FIG. 2 is a side view, not to scale, of a ROIC chip 10 in accordance with this invention. In this example a silicon substrate 12 has a layer 14 of circuitry disposed upon a first surface 12a. The circuit layer 14 is comprised of conventionally deposited metal, polysilicon and the like, and is fabricated to provide, by example, an array of amplifiers for reading out and amplifying photo-induced charge from a corresponding array of radiation detector pixels.

Figure 1:
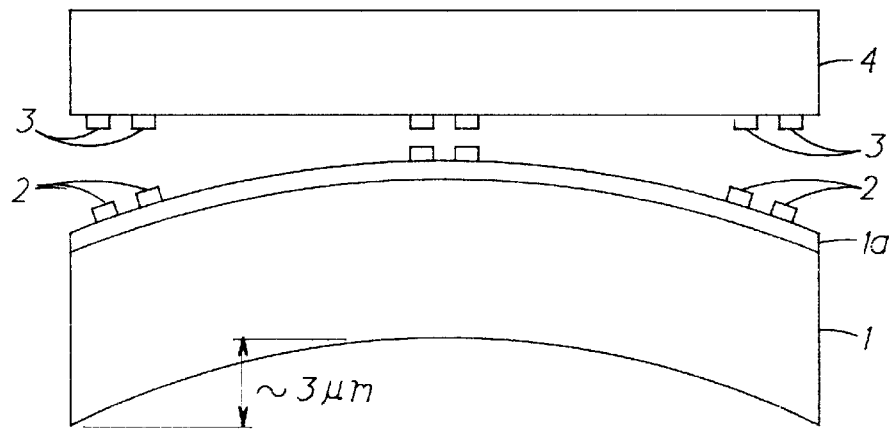
FIG. 1 is an enlarged side view, not to scale, of a ROIC and an array of radiation detectors of the prior art.

As was described previously, the stress induced by the layer 14 causes a force to be exerted on the substrate 12, which in turn results in an upward bowing of the substrate 12. That is, a center of the circuit layer 14 is disposed further from a surface upon which the substrate 12 rests than are the peripheral portions of the circuit layer 14. As was indicated in FIG. 1, the bowing may be 3 μm or greater. As employed herein, a degree or amount of bowing and a degree or amount of non-flatness both refer to the curvature of the substrate 12 (and the overlying circuit layer 14). A substrate 12 having no bowing is considered to be flat.

Shown on the layer 14 are a plurality of indium bumps 16, which are used during a hybridization process for electrically interconnecting the ROIC 10 to the radiation detector array 4.

In accordance with this invention the ROIC 10 further includes a film or layer 18 that is applied to the surface 12b that is opposite the surface 12a that underlies the circuit layer 14. The layer 18 is applied to a predetermined thickness so as to substantially reduce or eliminate the bowing, thereby resulting in a flattening of the ROIC 10. By example, the bowing may be reduced to less than 1 μm, as compared to the 3 μm exhibited by the conventional ROIC 1 of FIG. 1.

In a presently preferred embodiment of this invention the thickness (Th) of the layer 18 (in Angstroms) is determined in accordance with the expression:

$$Th = c_1(\text{number of fringes}) - c_2;$$

where $c_1$ is a first constant that is related to the stress per unit thickness of the material of the layer 18, where the number of fringes is determined by observation (see FIG. 4A), where each fringe corresponds to, by example, 0.3 μm, and where $c_2$ is a second constant that is related to a minimum thickness of the layer 18 before an observable effect is achieved. By example, and when using a silicon substrate 12, $Si_3N_4$ for the material of layer 18, and a HeNe laser as a part of an interferometric system, $c_1$ is approximately 910 and $c_2$ is approximately 70. Typical thicknesses for the layer 18 are in a range of approximately 1500 Å to approximately 2000 Å.

It is preferred to apply the layer 18 to the individual ROICs after dicing so as to adequately compensate for the variation in bowing that occurs across the wafer. That is, the amount of bowing typically depends upon which part of the wafer the ROIC chip originated from, and a single value calculated for the entire wafer may not be appropriate for all of the ROICS.

Sputtering $Si_3N_4$ is a presently preferred technique to apply the layer 18, although the teaching of this invention is not limited in this regard. By example, $SiO_2$ can also be employed, although $SiO_2$ is known to quickly switch from a tensile state to a compressive state as a function of thickness. $Si_3N_4$ by contrast is always found in the desired tensile state. The use of $Si_3N_4$ has also been found to provide greater reproducability. Other deposition techniques can also be used to apply the layer 18.

It should be appreciated that several materials can be used to form the layer 18, so long as the selected materials apply a compensating force to the substrate 12 that is opposite to the deforming force applied by the overlying circuit layer 14. Another consideration is that the material of the layer 18 should be compatible with the substrate material so as to exhibit adequate adhesion. Also, and in that a hybridized photodetector/readout assembly is typically exposed to elevated temperatures during Dewar bakeout and storage, and to cryogenic temperatures during operation, it is preferred that the coefficient of thermal expansion (CTE) of the material of the layer 18 be compatible with the CTE of the substrate material. $Si_3N_4$ is one material that fulfills these various criteria.

Although it is preferred at present to predetermine the thickness of the layer 18 before applying same, it is also within the scope of this invention to measure the amount of flattening in-situ as the layer 18 is applied, and to then terminate the deposition of the layer 18 when the desired degree of flatness is obtained.

Figure 3A:
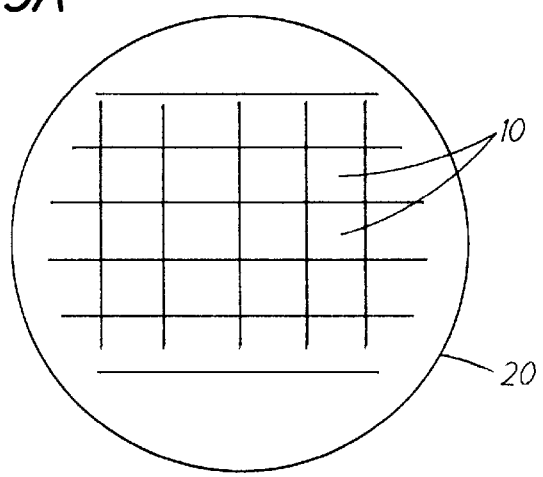
FIGS. 3A–3C illustrate an embodiment of process steps in accordance with this invention.
Figure 3B:
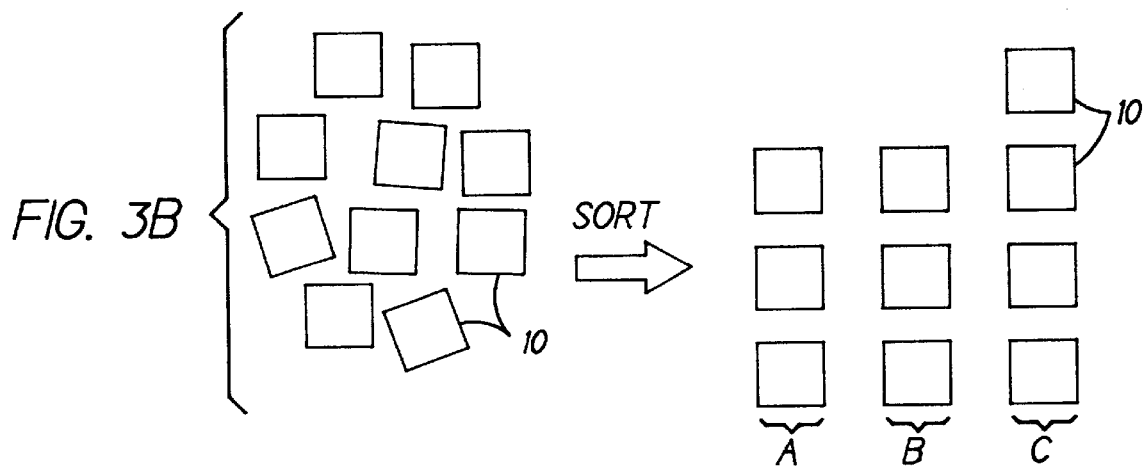
Figure 3C:
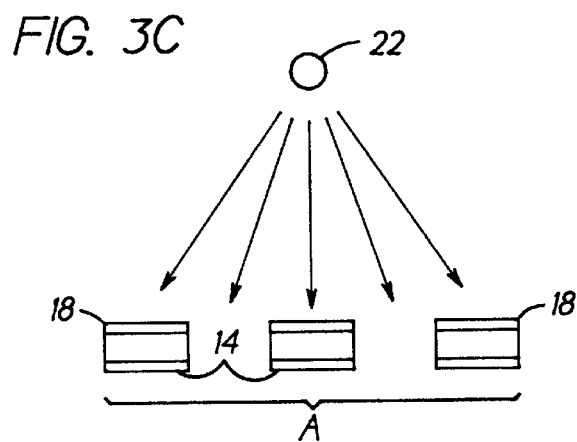

FIGS. 3A–3C illustrate a presently preferred method of this invention. In FIG. 3A a wafer 20 is provided, the wafer 20 having a plurality of the readout integrated circuits 10 formed in and upon a first surface thereof. In FIG. 3B the wafer 20 is diced to yield a plurality of individual readout integrated circuits 10. Each readout integrated circuit 10 is comprised of the substrate material 12 of the wafer (e.g., silicon) and has the layer 14 of active circuitry disposed on one side. As was indicated previously, each of the readout integrated circuits 10 typically has some amount of bowing (i.e., non-flatness) associated therewith. The degree of bowing of each readout integrated circuit 10 can be a function of its position within the wafer 20.

Figure 4A:
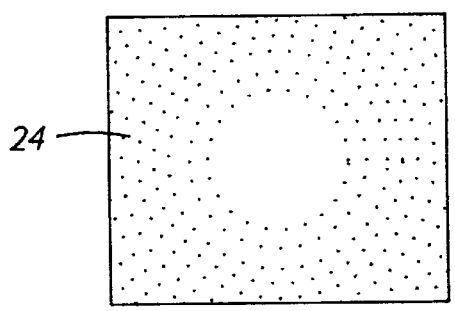
FIG. 4A is a Fizeau interferogram obtained from a ROIC before the application of a backside film layer in accordance with this invention.

The readout integrated circuits 10 are next sorted using, preferably, an interferometer so as to yield a plurality of groups (e.g., A, B, C,) having a similar degree of bowing. Each group includes from one to some larger number of readout integrated circuits 10. FIG. 4A illustrates a typical interferogram obtained from a readout integrated circuit 10. The larger the number of fringes 24 the greater is the amount of non-flatness, that is, the greater is the bowing of the readout integrated circuit 10.

Figure 4B:
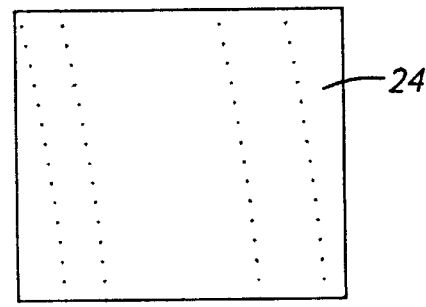
FIG. 4B is a Fizeau interferogram obtained from the ROIC of FIG. 4A after the application of the backside film layer in accordance with this invention.

In FIG. 3C, and in accordance with the expression given above, a thickness for the compensating layer 18 is determined for each of the plurality of groups. The readout integrated circuits 10 of a given group are then placed into a growth chamber, such as a sputtering chamber, and the layer 18 is grown from a suitable source or sources 22. The growth of the layer 18 is continued until the predetermined thickness is achieved. FIG. 4B illustrates a second interferogram which shows the significant reduction in the number of fringes and hence, the degree of flattening of the readout integrated circuit 22 that is caused by the application of the layer 18.

A next, unillustrated, step hybridizes each of the readout integrated circuits 10 with a corresponding array of radiation detectors. In a presently preferred embodiment of the invention the arrays of radiation detectors are comprised of Group II-VI material, such as HgCdTe, and are responsive to electromagnetic radiation in the infrared spectrum.

In accordance with the teaching of this invention, by measuring the bowing of the ROIC and then depositing the film 18 with the appropriate thickness and stress characteristics, the ROIC can be made flat in its "free" state. Several advantages result from a flattening of the ROIC 10.

A first advantage is that the improvement in flatness results in better cold-welding of the indium bumps in the corners. This improves operability and thermal cycle reliability.

A second advantage is an improvement in hybridization. Bowed ROICs are difficult or impossible to hold on a vacuum chuck during hybridization. The fringing caused by interference between the ROIC and sapphire during hybridization also disrupts the visual clues necessary for accurate alignment of the FPA components (detector array and ROIC). Warpage in components also causes hybridization slip when parts of the arrays contact each other at different times.

A third advantage is an improvement in transmission of near-IR radiation that is used for viewing the detector and readout hybridization alignment marks. This results from an anti-reflection coating effect due to the index of refraction and thickness of the backside coating (silicon index of refraction=3.4, $Si_3N_4$ layer index of refraction=2.0, thickness ≈2000Å). The approximate improvement in intensity is 33% (reflection of Si=50%, reflection of Si/backside coating is <17%).

A further advantage is an improvement resulting from a more uniform thickness of optical layers (hence better response uniformity) for thinned detectors, such as InSb detectors.

Another advantage that flows from the use of the teaching of this invention in a reduction in static stress within the ROIC 10 due to the reduction in the bowing. This also reduces the static stress on the components that are located in the circuit layer(s) 14, and thus further improves the reliability of the ROIC 10 and also the FPA assembly of which it is a part.

Although described in the context of readout integrated circuits for radiation detector arrays, such as relatively large (e.g., 256×256) staring type arrays, it should be appreciated that the teaching of this invention is generally applicable to integrated circuits that are desired to have a predetermined degree of flatness. That is, the teaching of this invention is not to be construed to be limited for use only with readout integrated circuits for radiation detectors.

Thus, while the invention has been particularly shown and described with respect to preferred embodiments thereof, it will be understood by those skilled in the art that changes in form and details may be made therein without departing from the scope and spirit of the invention.

What is claimed is:

1. A method for processing an integrated circuit chip, comprising the steps of:

providing the integrated circuit chip that includes a substrate and at least one first layer comprised of circuitry overlying a first surface of the substrate, the integrated circuit chip having an amount of bowing; and applying at least one second layer to a second, opposite surface of the substrate, the at least one second layer being applied so as to have a thickness sufficient for exerting a force upon the substrate for reducing the amount of bowing, wherein the step of applying includes a step of depositing a layer of dielectric material upon the second surface.

2. A method as set forth in claim 1 wherein the step of providing provides at least one readout integrated circuit chip of a type that is suitable for being hybridized with a chip comprised of an array of radiation detectors.

3. A method as set forth in claim 1 wherein the step of applying includes a step of depositing a layer comprised of $Si_3N_4$ upon the second surface.

4. A method as set forth in claim 1 wherein the step of applying includes a step of depositing a layer comprised of $SiO_2$ upon the second surface.

5. A method as set forth in claim 1 wherein the step of applying includes a step of sputtering a layer comprised of $Si_3N_4$ upon the second surface.

6. A method as set forth in claim 1 wherein the step of providing includes the steps of:

providing a plurality of integrated circuit chips;

sorting the plurality of integrated circuit chips into a plurality of groups according to the amount of bowing;

for each of the groups, determining a thickness of the second layer that is required to reduce the amount of bowing; and for said each of the groups, simultaneously applying the second layer to have the determined thickness.

7. A method as set forth in claim 6 wherein the step of sorting includes the steps of:

operating an interferometer to generate a pattern of fringes for indicating a degree of non-flatness of each of the integrated circuits; and counting the fringes and sorting the integrated circuits as a function of the number of fringes.

8. A method for processing readout integrated circuits, comprising the steps of:

providing a plurality of individual readout circuits each having a substrate and at least one layer comprised of active circuitry overlying a first surface of the substrate, each of the readout integrated circuits having an associated amount of non-flatness due at least in part to a first force exerted on the substrate by the at least one layer;

sorting the plurality of readout integrated circuits into a plurality of groups, wherein members of each group have a similar amount of non-flatness; and for each group, determining a thickness of and applying a compensating layer on a second surface of the substrate so as to exert a second force on the substrate to counteract the first force and to reduce the amount of non-flatness.

9. A method as set forth in claim 8 wherein the step of applying includes a step of sputtering a layer comprised of $Si_3N_4$ upon the second surface.

10. A method as set forth in claim 8 wherein the step of sorting includes the steps of:

operating an interferometer to generate a pattern of fringes for indicating a degree of non-flatness of each of the readout integrated circuits; and counting the fringes and sorting the readout integrated circuits as a function of the number of fringes.

* * * * *